United States Patent
Higashi et al.

(10) Patent No.: US 6,738,504 B1
(45) Date of Patent: May 18, 2004

(54) INSPECTION APPARATUS FOR SEMICONDUCTOR DEVICE AND PARTS MOUNTER USING SAME

(75) Inventors: Mitsutoshi Higashi, Nagano (JP); Kei Murayama, Nagano (JP)

(73) Assignee: Shinko Electric Industries Co., Ltd, Nagano (JP)

( * ) Notice: Subject to any disclaimer, the term of this patent is extended or adjusted under 35 U.S.C. 154(b) by 622 days.

(21) Appl. No.: 09/645,299

(22) Filed: Aug. 24, 2000

(30) Foreign Application Priority Data

Aug. 27, 1999 (JP) ............................. 11-241162

(51) Int. Cl.[7] .................................................. G06K 9/00
(52) U.S. Cl. ...................... 382/146; 382/147; 382/149
(58) Field of Search ....................... 382/141, 143–151; 348/86, 87, 125, 126; 356/237.1, 237.4, 237.5; 700/96; 438/16; 250/559.34

(56) References Cited

U.S. PATENT DOCUMENTS

| | | | |
|---|---|---|---|
| 4,821,157 A | | 4/1989 | Birk et al. |
| 5,115,475 A | * | 5/1992 | Lebeau ................. 382/146 |
| 5,249,239 A | * | 9/1993 | Kida ..................... 382/146 |
| 5,648,853 A | | 7/1997 | Stern et al. |
| 5,745,236 A | | 4/1998 | Haga |
| 5,991,434 A | * | 11/1999 | St. Onge ............... 382/146 |
| 6,211,959 B1 | | 4/2001 | Grasmuller |

FOREIGN PATENT DOCUMENTS

| | | |
|---|---|---|
| EP | 0252547 | 1/1988 |
| EP | 0501683 | 9/1992 |
| EP | 1065499 | 1/2001 |
| JP | 63-276300 | 5/1987 |
| JP | 7-325036 | 5/1994 |
| WO | WO 98/39795 | 9/1998 |
| WO | WO 00/16071 | 3/2000 |

* cited by examiner

*Primary Examiner*—Vikkram Bali
(74) *Attorney, Agent, or Firm*—Paul & Paul

(57) ABSTRACT

An inspection apparatus for semiconductor devices, comprising: a light irradiation means for irradiating light to a surface of a semiconductor device, the surface having external connection terminals formed thereon; an image pickup means for picking up a plane image of the surface of the semiconductor device by using an optical system to provide an image data; an inspection means for inspecting misalignment of tips of the external connection terminals based on the image data; the external connection terminals standing on, and being bonded to, electrode pads of the semiconductor device and being bent to crank shapes having respective middle portions laterally extending out of positions of the electrode pads; and the irradiation means irradiating light from a side opposite to the laterally extending middle portions of the external connection terminals with respect to the electrode pads.

6 Claims, 6 Drawing Sheets

INSPECTION APPARATUS FOR SEMICONDUCTOR DEVICE AND PARTS MOUNTER USING SAME

BACKGROUND OF THE INVENTION

1. Field of the Invention

The present invention relates to an inspection apparatus for inspecting misalignment of the tips of the external connection terminals of a semiconductor device and a parts mounter using the same.

2. Description of the Related Art

The conventional inspection of misalignment of the external connection terminals of a semiconductor device, particularly inspection of occurrence of bends in easily bendable pin-form external connection terminals forming a pin grid array (PGA), includes irradiating light from a ring-form light source onto an external connection terminal carrying surface of a semiconductor device and picking up a plane image of the external connection terminal carrying surface under the condition that the shadows of the external connection terminals are as weak as possible. The plane image is then processed, based on brightness, so that bright spots are defined as the areas including the tips and then the centers of gravity of the areas are determined as the positions of the tips in a two-dimensional plane. The thus-determined positions of the tips are judged as to whether or not they fall within a reference area, thereby completing the inspection of misalignment of the tips, i.e., of bends in the pin-form external connection terminals.

The conventional inspection can be successfully applied to an external connection terminal in the form of a straight pin standing upright on an electrode pad.

However, the conventional inspection cannot be successfully applied to recent semiconductor devices, such as that shown in FIG. 1, in which cranked external connection terminals 14 normally include a bend because the middle portions extending laterally away from the positions of the electrode pads 10.

Thus, the cranked external connection terminals normally include a displacement of the tips with respect to the positions of the electrode pads 10. Referring to FIGS. 3A and 3B, when a ring-form light source irradiates the cranked external connection terminals (FIG. 3A), the bright Spots B of the electrode pads 10 and the bright spots C of the tips A are very close (FIG. 3B), so that it is difficult to distinguish both spots B and C from each other when determining the positions of the tips A, finally causing a difficulty in providing precise inspection of the misalignment of the tips A.

SUMMARY OF THE INVENTION

An object of the present invention is to provide an inspection apparatus for semiconductor devices which enables precise inspection of the misalignment of the tips of external connection terminals formed of cranked metal wires.

Another object of the present invention is to provide a parts mounter including the inspection apparatus.

To achieve the object according to the present invention, there is provided an inspection apparatus for semiconductor devices comprising:

a light irradiation means for irradiating light to a surface of a semiconductor device, the surface carrying external connection terminals formed thereon;

an image pickup means for picking up a plane image of the surface of the semiconductor device by using an optical system to provide image data;

an inspection means for inspecting misalignment of tips of the external connection terminals based on the image data;

the external connection terminals standing on, and being bonded to, electrode pads of the semiconductor device and being bent into crank shapes having respective middle portions extending laterally away from positions of the electrode pads, and the light irradiation means irradiating light from a side opposite to the laterally extending middle portions of the external connection terminals with respect to the electrode pads.

The external connection terminal is generally formed by ball-bonding a gold or other metal wire to the electrode pad, so that the pad top forms a hemispheric convex surface having one side which reflects the light from the light irradiation means in the direction opposite to the direction in which the middle portion of the cranked external connection terminal extends away from the position of the electrode pad. The other side of the convex hemispheric pad top is not irradiated by the light from the light irradiation unit and is not bright.

Therefore, the bright spot of the electrode pad forms a half-moon shape having a dark side facing the bright spot of the tip of the external connection terminal to provide an increased distance between the bright spot of the electrode pad and the bright spot of the tip of the external connection terminal in comparison with that provided by the conventional lighting by a ring-form light source, so that the bright spots of the tips of the external connection terminals are easily distinguished from the bright spots of the electrode pads to determine the positions of the tips, thereby providing precise inspection of misalignment of the tips.

The optical system is advantageously telecentric on an object side or on both object and image sides. With the telecentric optical system as specified, the light reflected from the tips of the external connection terminals has substantially parallel principal rays, so that any variation in the height of the semiconductor device as an inspection object would cause no inspection errors in the peripheral portion of the object, i.e., parallax errors due to field angle, to provide an improved precision in inspecting misalignment of the tips of the external connection terminals.

According to the present invention, there is also provided a parts mounter comprising:

a holding head for holding and releasing a semiconductor device;

a head transfer unit for three-dimensionally transferring the holding head;

an inspection apparatus for semiconductor devices according to claim 1 or 2 and placed in an inspection position; and a control unit for controlling the holding head when holding and releasing the semiconductor device, the head transfer unit when transferring the holding head, and the inspection apparatus when inspecting misalignment of tips of external connection terminals so that the semiconductor device is held by the holding head, transferred to the inspection position by the head transfer unit, and inspected for the misalignment by the inspection apparatus.

DESCRIPTION OF THE PREFERRED EMBODIMENTS

Figure 1:
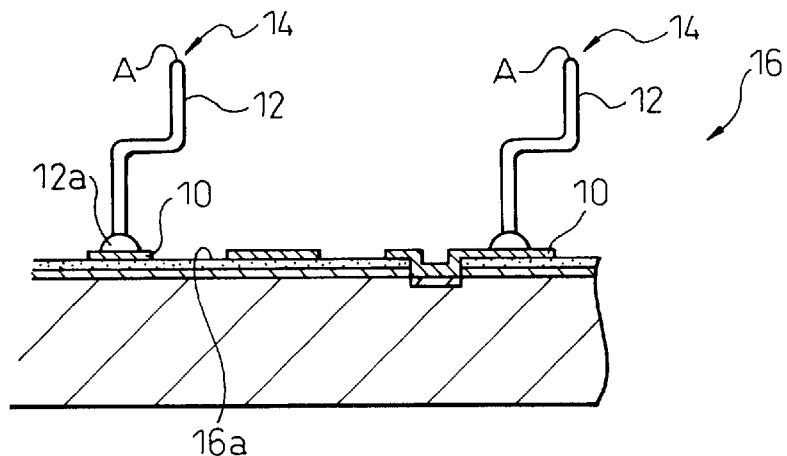
FIG. 1 shows a cross-section of a semiconductor device having cranked external connection terminals which can be advantageously inspected by an inspection apparatus according to the present invention.
Figure 2:
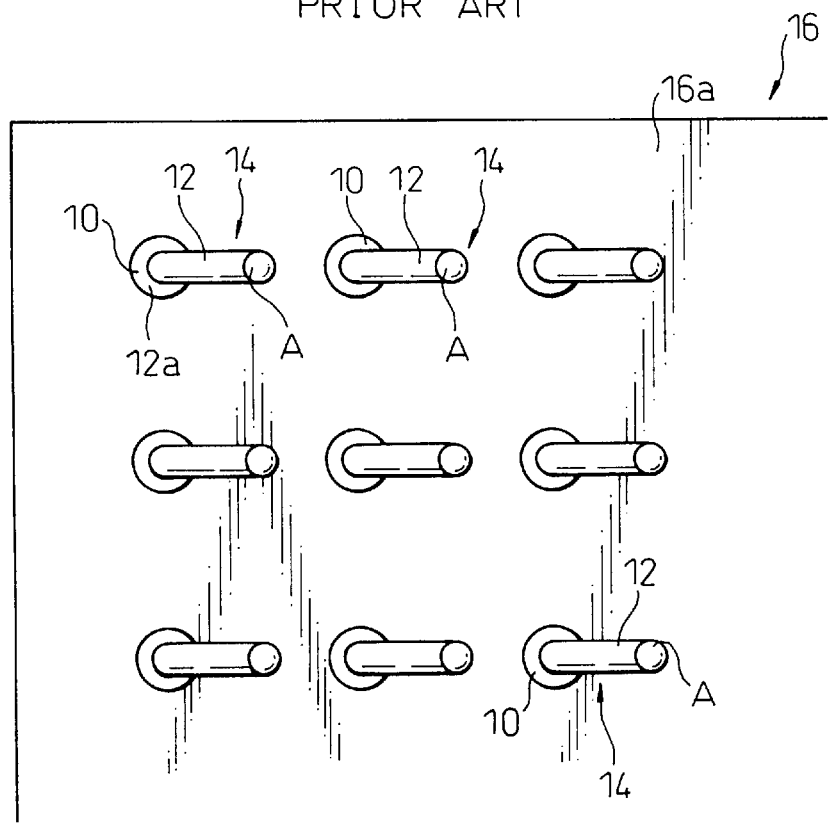
FIG. 2 shows a plan view of the semiconductor device shown in FIG. 1.

FIGS. 1 and 2 show, in cross-sectional and plan views, a semiconductor device having cranked external connection terminals to which the present invention is advantageously applied.

A semiconductor device 76 has electrode pads 10 and cranked external connection terminals 14 standing on, and bonded to, the electrode pads 10. The cranked external connection terminals 14 are formed by bent metal wires 12 each having a middle portion extending laterally away from the position of the corresponding electrode pad 10 in the right direction on the drawings to provide a spring property.

The crank is formed, using a capillary, by ballbonding a thin wire 12 of gold or another metal to one of the electrode pads 10 on the external connection terminal carrying surface 16a of the semiconductor device 16, pulling the bonded wire 12 upward so that the wire 12 stands upright on the pad 10, bending the wire 12, at a lower point, laterally with respect to the upright wire 12, further bending the wire 12 upward at a higher point, and electrodischarge-cutting the wire 12 at a designed height to provide the crank form or a fallen-Z shape. The same process is repeated for every one of the pads 10.

Because the wire 12 is ball-bonded to the pad 10, the pad 10 after bonding has a convex hemispheric top surface defined by a root portion of the wire 12 that covers the initial surface of the pad 10.

Unlike the conventional pin grid array formed by attaching, to a substrate, stiff straight pins previously cut in a designed length, the above-mentioned process of forming cranked pins involves a greater possibility of misalignment in both the vertical and the lateral directions because the wire must be bent on each of the electrode pads and because electrodischarge cutting unavoidably includes a small time lag between the start of the discharge and the completion of cutting.

Moreover, the cranked external connection terminal formed by bending a thin wire has a much lower strength than the PGA pin and can be easily bent during transport or other handling, also causing a greater possibility of misalignment in both vertical and lateral directions.

It is therefore absolutely required that, before shipment from a supplier, the semiconductor device 16 must be inspected as to whether the tips A of the external connection terminals 14 are in the designed proper positions by frontally viewing the external connection terminal carrying surface 16a of the semiconductor device 16. Users must also conduct the inspection before mounting the supplied semiconductor device on a motherboard. Thus there is need for an inspection apparatus for semiconductor devices and a parts mounter having the inspection apparatus installed therein.

Referring to FIGS. 1 to 6, an inspection apparatus according to the present invention operated as follows.

Figure 4:
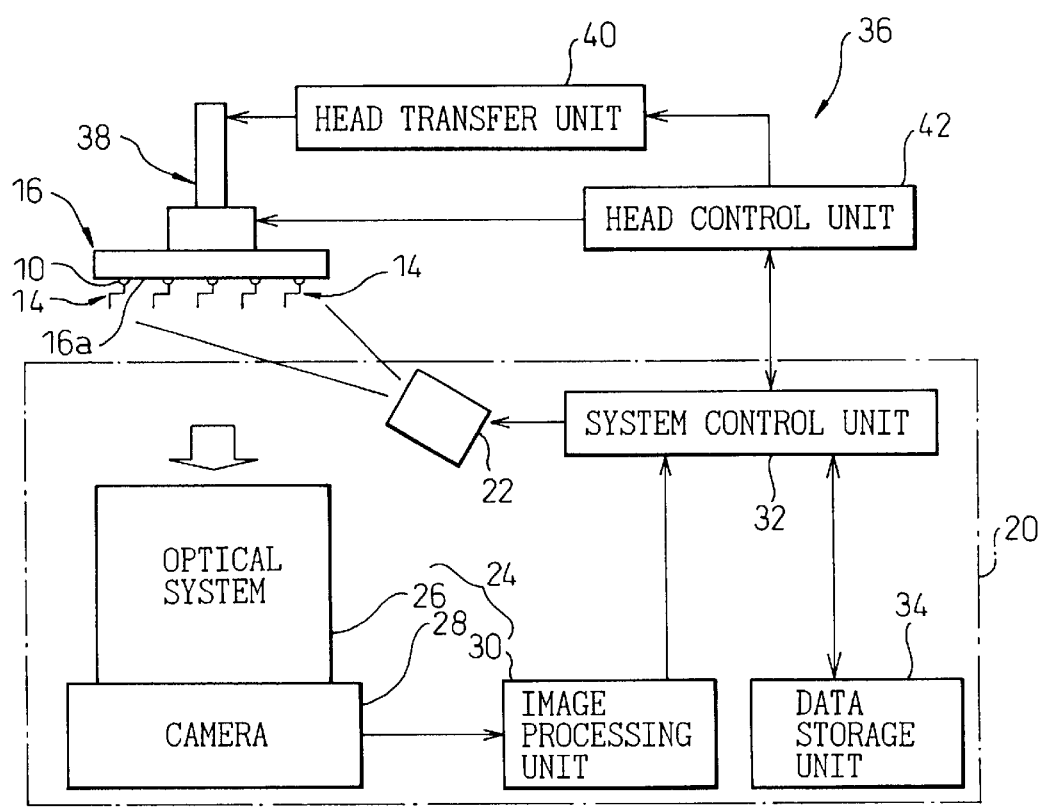
FIG. 4 shows a block diagram of a parts mounter including an inspection apparatus according to the present invention.
Figure 5A:
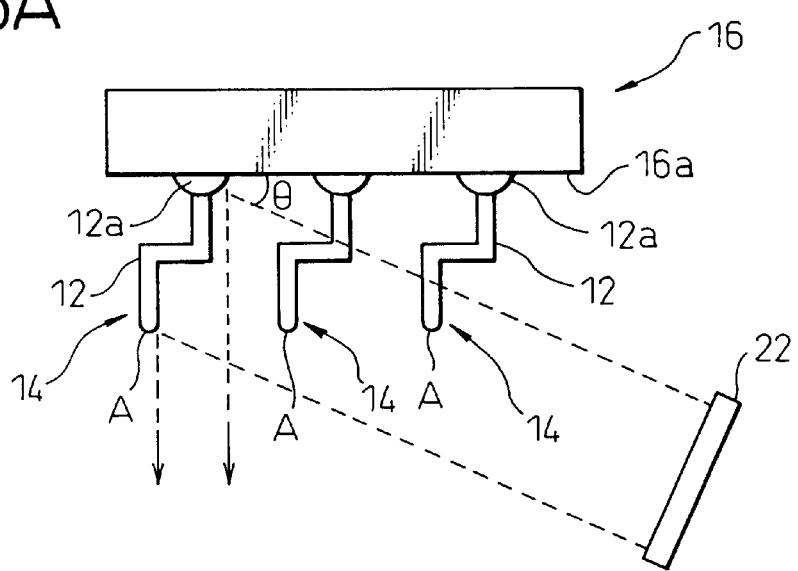
FIG. 5A shows a side view of a semiconductor device having cranked external connection terminals under inspection according to the present invention.

A light irradiation unit 22 (FIG. 4) irradiates light onto the surface 16a of the semiconductor device 16 that has the external connection terminals 14 formed thereon, only from a side opposite to the laterally extending middle portions of the external connection terminals 14 with respect to the electrode pads 10 and from obliquely above but not from directly above (FIG. 5A). The light irradiation unit 22 preferably has a line or area light source, not a point light source, to irradiate substantially parallel light rays so that the external connection terminals 14 standing on the surface 16a of the semiconductor device 16 are evenly irradiated by the light under the above-specified condition to provide a plane image to the image pickup assembly as will be hereinafter described in detail. The light irradiation unit 22 may be conveniently prepared by partially shielding a popular inexpensive ring light with a light shield plate to allow light to be irradiated in a single direction as specified. Light emitting diodes (LEDS) may be arranged in plane to provide irradiation of parallel light rays.

The light irradiation unit 22 preferably has an LED, a cylindrical lens system, or other highly directive lighting devices to facilitate selective reflection from the tips A of the external connection terminals 14 to provide inspection of the external connection terminals 14 with an improved clarity.

In contrast to the conventional surrounding lighting from a ring light source, the present invention irradiates light to the external connection terminal carrying surface 16 in a single direction from obliquely above to provide the following advantages.

Figure 3A:
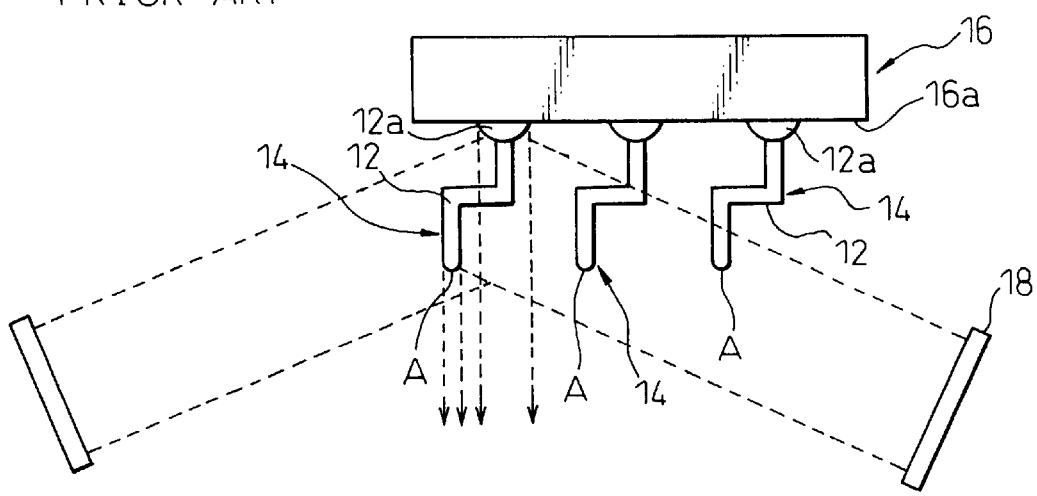
FIG. 3A shows a side view of a semiconductor device having cranked external connection terminals under the prior art inspection.
Figure 3B:
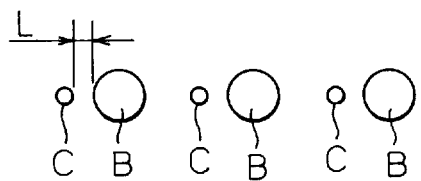
FIG. 3B shows a plane image of the cranked external connection terminals shown in FIG. 3A, imaged by the conventional inspection.

As previously noted, when the surface 16a carrying the external connection terminals 14 of the semiconductor device 16 is subject to irradiation of light in all directions by a ring light source as shown in FIG. 3A, the tips A of the external connection terminals 14 form the bright spots C, and at the same time, the convex hemispheric roots 12a of the external connection terminals 14 also form the larger circular bright spots B as shown in FIG. 3B. Because the larger circular bright spots B of the roots 12a are very close to the bright spots C of the tips A, the bright spots C are difficult to detect separately from the bright spots B. Therefore, the positions of the tips A cannot be precisely detected to prevent inspecting misalignment of the tips A with a practically acceptable precision.

Figure 5B:
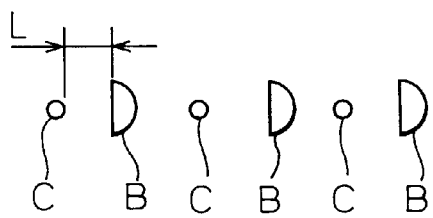
FIG. 5B shows a plane image of the cranked external connection terminals shown in FIG. 5A, imaged by an inspection apparatus according to the present invention.

In contrast, according to the present invention, the surface 16a carrying the external connection terminals 14 of the semiconductor device 16 is subject to irradiation of light from obliquely above in a single direction opposite to the direction of the middle portions extending away from the positions of the roots 12a or pads 10 as shown in FIG. 5A, so that the roots 12a having the convex hemispheric surface are only irradiated on the side facing the light source 22 and are not irradiated on the other side. As the result, as shown in FIG. 5B, the bright spots B of the electrode pads 10 form half-moon shapes having the dark side facing the bright spots C of the tips A of the external connection terminals 14 to provide an increased distance L between spots B and C En comparison with the conventional ring lighting in all directions providing circular spots B of the pads 10, so that the spots C of the tips A are easily distinguished from the spots B of the pads 10 in image processing to ensure precise determination of the positions of the tips A, thereby providing precise inspection of misalignment of the tips A of the external connection terminals 14.

The carrying surface 16a may not be imaged at once but may be imaged region by region, when the external connection terminals 14 are densely disposed on the carrying surface 16a, or when the middle portions of the cranked external connection terminals 14 extend in different directions in different regions of the carrying surface 16a. In this case, the light irradiation unit 22 and the image pickup assembly 24 can be reduced in size to irradiate substantially parallel light rays to a unit region of the carrying surface 16a.

The image pickup assembly 24 includes an optical system 26 and a camera 28 of a CCD or other type to pick up a plane image of the carrying surface 16a carrying the external connection terminals 14. To provide precise inspection of the positions of the tips A of the external connection terminals 14, a peripheral distortion in the plane image must be minimized. To this end, according to a preferred embodiment of the present invention, the optical system is telecentric on object side or on both object and image sides, so that the peripheral distortion can be minimized while the optical system is reduced in size. An object-size type telecentric optical system, for example, is disclosed in JP-A-7-325036. The telecentric optical system has entirely parallel principal light rays in an object space and provides a minimized peripheral distortion, so that precise inspection of the tips A of the external connection terminals 14 is achieved even with a lens having a small aperture.

In an arrangement in which the optical system 26 (FIG. 4) of the image pickup assembly 24 is positioned to have an optical axis perpendicular to the surface 16a and to the laterally extending middle portions of the external connection terminals 14, the light irradiation unit 22 is preferably positioned to irradiate light at an angle θ (FIG. 5A) of greater than 0° and not greater than 45° with respect to the surface 16a so that the optical system 26 receives no bright images of the surface 16a and the middle portions of the external connection terminals 14 but only receives a bright image of the tips A of the external connection terminals 14 to facilitate inspection of the external connection terminals 14 with an improved clarity. If the angle θ is greater than 45°, the optical system 26 receives bright images not only of the tips A but also of the surface 16a and the middle portions of the external connection terminals 14 to prevent good inspection. The angle θ must be greater than 0° to provide bright spots C of the tips A.

In an arrangement in which the optical system 26 is positioned to have an optical axis not perpendicular, but inclined at an angle α (α=90°), to the surface 16a and to the laterally extending middle portions of the external connection terminals 14, the angle α is preferably θ ± (10° to 90°) to provide a bright image of the tips A in a dark background to facilitate good inspection with an improved clarity. If the angle α is nearly equal to the angle θ, recognition of the tips A is prevented by an intense reflection light from the other portions.

The image pickup assembly 24 also includes an image processing unit 30 which converts the imported image data into binary data for digital processing in an inspection unit or system control unit 32 and which also effects differentiation of the image data to provide an improved recognition precision. The image processing unit 30 may be separate from the image pickup assembly 24.

The system control unit 32 acts as an inspection unit which inspects misalignment of the tips A of the external connection terminals 14 by pattern matching or other methods based on the image data of the plane image imported to the image pickup assembly 24, so that any external connection terminals having tips A misaligned, with respect to the proper positions, can be inspected.

The system control unit 32 also controls the light irradiation unit 22 to irradiate light at an intensity suitable for the image pickup assembly 24.

A data storage unit 34 stores data such as a reference data for pattern matching.

Figure 6:
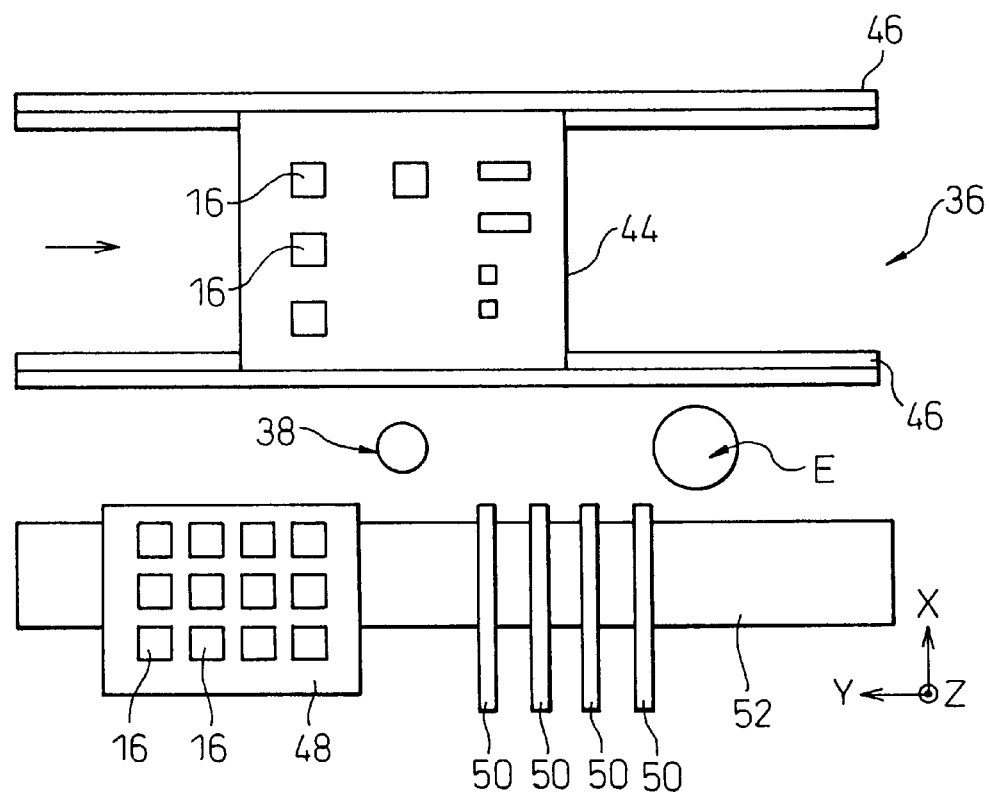
FIG. 6 shows a plan view of a parts mounter to which the present invention is advantageously applied.

Referring to FIGS. 4 and 6, a parts mounter 36 including the inspection apparatus 20 operates as follows.

A holding head 38 holds and releases a semiconductor device 16 by absorption or the like. The parts mounter 36 may be also used for mounting electronic parts other than the semiconductor device 16 with the holding head 38 adapted therefor.

The holding head 38 is three-dimensionally moved by a head transfer unit 40 and is rotated to orient the semiconductor device 16 absorbed thereto in the necessary directions. The head control unit 42 controls the absorption and release operation of the holding head 38 is and controls the motion of the head transfer unit 40.

The parts mounter 36 also includes a transport line 46 for transporting a substrate on which the semiconductor device 16 or other electronic parts are to be mounted and a parts supply station 52 having a supply tray 48 for supplying the semiconductor device and a tape feeder 50 for feeding other small electronic parts.

The inspection apparatus 20 is disposed between the transport line 46 and the parts supply station 52 to inspect misalignment of the tips A of the external connection terminals 14 of the semiconductor device held on the holding head 38. When an inspection apparatus 20 is adapted for inspection of the semiconductor device 16 having cranked external connection terminals 14, another inspection apparatus, if necessary, may be also disposed next the inspection apparatus 20 to effect inspection of electronic parts other than the semiconductor device 16. The inspection apparatus 20 may have a light source which is exchangeable with a ring light source for inspection of other electronic parts.

In an embodiment, the system control unit 32 of the inspection apparatus 20 may also control the head control unit 42, thereby controlling the absorption and release operation of the holding head 38 and the transfer motion of the holding head 38, so that the system control unit 32 acts as a control unit of the parts mounter 36.

In the above-described arrangement, the holding head 38 is transferred to the parts supply station 52 and holds a predetermined electronic part by absorption, and when the electronic part is a semiconductor device having cranked external connection terminals 14, the head 38 is then transferred to an inspection position E at which the inspection apparatus 20 is disposed where the tips A of the external connection terminals 14 are inspected for misalignment.

When the inspected result is good, the head 38 is transferred to a mounting position on a substrate 44, mounts the semiconductor device 16 on the substrate 44 in position, releases the semiconductor device 16 and is returned to the parts supply station 52 for holding the next semiconductor device 16.

The inspection apparatus 20 basically inspects lateral misalignment of the tips A in a plane parallel to the external connection terminal carrying surface 16a of the semiconductor device, and if necessary, the apparatus 20 may also inspect vertical misalignment or variation in height of the tips A by limiting the depth of field of the optical system 26 so that only the tips A having a proper height are covered with the limited depth of field and other images are out of focus, i.e., a tip A having a height not covered with the limited depth of field provides an increased size of bright spot easily detected by the inspection apparatus.

Figure 7:
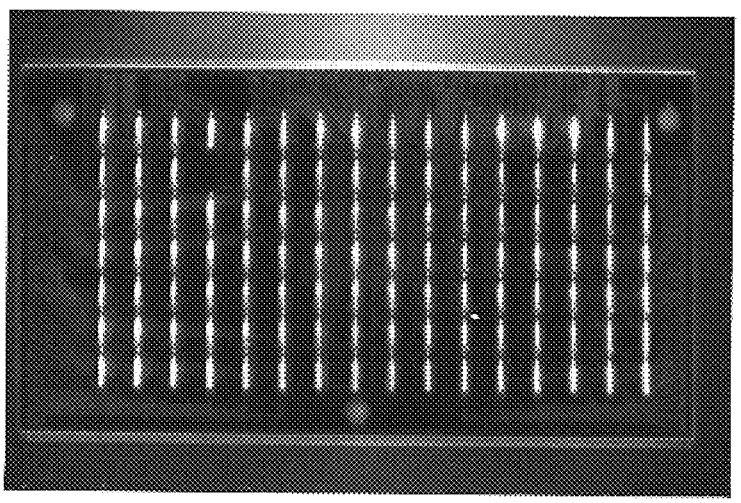
FIG. 7 shows an image of an external connection terminal carrying surface having cranked external connection terminals of a semiconductor device, imaged by the conventional inspection.
Figure 8:
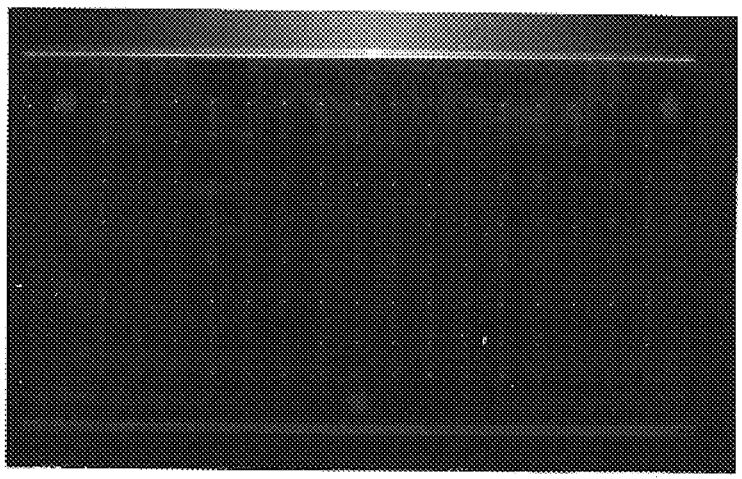
FIG. 8 shows an image of the same external connection terminal surface as shown in FIG. 7, imaged by the inspection according to the present invention.
Figure 9:
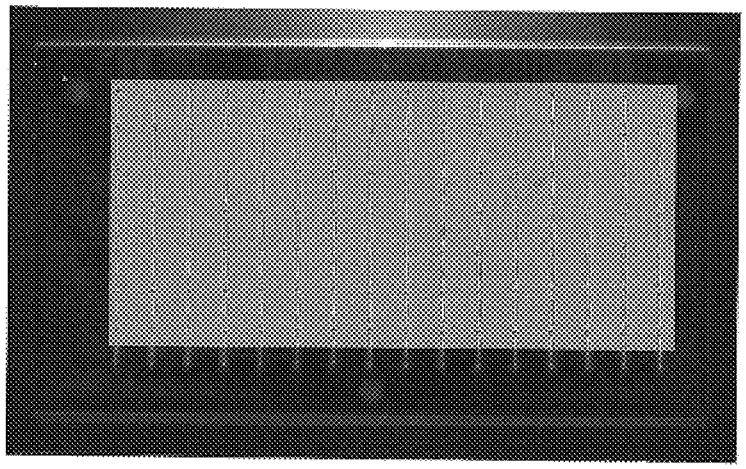
FIG. 9 shows an image processed from the image shown in FIG. 8 according to the present invention.

FIGS. 7, 8 and 9 are photographs showing images of an external connection terminal carrying surface having cranked external connection terminals of a semiconductor device, in which FIGS. 7 and 8 show the images taken by the camera 28 in the conventional apparatus and in the present inventive apparatus, respectively, and FIG. 9 shows an image processed from the image shown in FIG. 8 according to the present invention. In the conventional image shown in FIG. 7, the images of the tips A of the external connection terminals are not distinguishable from the images of other portions of the external connection terminals. In contrast, in the present inventive images shown in FIG. 8 or 9, the images of the tips of the external connection terminals are clearly distinguished from other images.

As herein described, the present invention provides an inspection apparatus for semiconductor devices which enables precise inspection of misalignment of the tips of external connection terminals formed by cranked metal wires. The present invention also provides a parts mounter including the inspection apparatus.

What is claimed is:

1. An inspection apparatus for semiconductor devices, comprising:
    a light irradiation means for irradiating light to a surface of a semiconductor device, the surface carrying external connection terminals formed thereon;
    an image pickup means for picking up a plane image of the surface of the semiconductor device by using an optical system to provide an image data;
    an inspection means for inspecting misalignment of tips of the external connection terminals based on the image data;
    the external connection terminals standing on, and being bonded to, electrode pads of the semiconductor device and being bent into crank forms having respective middle portions extending laterally away from positions of the electrode pads, wherein the external connection terminals have substantially hemispherical roots where the external connection terminals are bonded to the electrode pads of the semiconductor device; and
    the light irradiation means being positioned such that the surface of the semiconductor device is irradiated from a direction obliquely above the surface of the semiconductor device and generally opposite the direction in which the middle portions of the external connection terminals extend away from the electrode pads, such that only one side of the substantially hemispherical roots of the external connection terminals is irradiated.

2. An inspection apparatus according to claim 1, wherein the optical system is telecentric on an object side or on both object and image sides.

3. An inspection apparatus according to claim 1, wherein the optical system is positioned to have an optical axis perpendicular to the surface and to the middle portions of the external connection terminals and the light irradiation means is positioned to irradiate light at an angle θ of greater than 0° and not greater than 45° with respect to the surface.

4. An inspection apparatus according to claim 1, wherein the light irradiation means is positioned to irradiate light at an angle θ with respect to the surface, the optical system is positioned to have an optical axis not perpendicular, but inclined at an angle α, wherein α≠90°, to the surface and to the middle portions of the external connection terminals, and the angle α is θ±10° to 90°.

5. A parts mounter comprising:
    a holding head for holding and releasing a semiconductor device;
    a head transfer unit for three dimensionally transferring the holding head;
    an inspection apparatus for semiconductor devices according to claim 1 or 2 and placed in an inspection position; and
    a control unit for controlling the holding head when holding and releasing the semiconductor device, the head transfer unit when transferring the holding head, and the inspection apparatus when inspecting the misalignment of the tips of external connection terminals so that the semiconductor device is held by the holding head, transferred to the inspection position by the head transfer unit, and inspected for the misalignment by the inspection apparatus.

6. An inspection apparatus according to claim 1, wherein the light irradiation means is positioned to irradiate light at an angle θ of greater than 0° and not greater than 45° with respect to the surface, the optical system is positioned to have an optical axis not perpendicular, but inclined at an angle α, wherein α≠90°, to the surface and to the middle portions of the external connection terminals, and the angle α is θ±10° to 90°.

* * * * *